(12) United States Patent
Schindler et al.

(10) Patent No.: US 11,556,023 B2
(45) Date of Patent: *Jan. 17, 2023

(54) OBJECT PROVIDED WITH AN ELECTRO-OPTIC DISPLAY DEVICE

(71) Applicant: The Swatch Group Research and Development Ltd, Marin (CH)

(72) Inventors: Axel Schindler, Ins (CH); Alain Hamm, Neuchatel (CH)

(73) Assignee: The Swatch Group Research and Development Ltd, Marin (CH)

( * ) Notice: Subject to any disclaimer, the term of this patent is extended or adjusted under 35 U.S.C. 154(b) by 360 days.

This patent is subject to a terminal disclaimer.

(21) Appl. No.: 16/597,223

(22) Filed: Oct. 9, 2019

(65) Prior Publication Data

US 2020/0142238 A1 May 7, 2020

(30) Foreign Application Priority Data

Nov. 6, 2018 (EP) ..................... 18204699

(51) Int. Cl.
  *G02F 1/1333* (2006.01)
  *G02F 1/133* (2006.01)
  (Continued)

(52) U.S. Cl.
  CPC .... *G02F 1/133331* (2021.01); *G02F 1/13306* (2013.01); *G02F 1/13332* (2021.01);
  (Continued)

(58) Field of Classification Search
  CPC ............. G02F 1/13452; G02F 1/13306; G02F 1/13439; G02F 1/133308; G02F 1/133317;
  (Continued)

(56) References Cited

U.S. PATENT DOCUMENTS 10,877,331 B2 * 12/2020 Schindler ............ H01L 51/5259
2002/0071347 A1 * 6/2002 Gilomen .............. G04G 9/0082
  368/82
(Continued)

FOREIGN PATENT DOCUMENTS

CN  1212377 A  3/1999
CN  1359039 A  7/2002
(Continued)

OTHER PUBLICATIONS

Japanese Office Action dated Nov. 10, 2020 in Japanese Patent Application No. 2019-197012 (with English translation), 6 pages.
(Continued)

*Primary Examiner* — Dung T Nguyen
(74) *Attorney, Agent, or Firm* — Oblon, McClelland, Maier & Neustadt, L.L.P.

(57) ABSTRACT

An object includes an electro-optic display device provided with an optically active element, the optical properties thereof can be modified by applying an electric voltage or current between at least one electrode and one corresponding auxiliary electrode, between which the optically active element is disposed. The object further includes a middle part which delimits an opening closed by a crystal including a bottom surface beneath which the electro-optic display device is arranged. The crystal is provided with an opaque frame which is made remotely from the edges of the opening and which covers the contour of the electro-optic display device so as to conceal electrical connection elements. The electro-optic display device defines an active display area which is confined by the opaque frame, such that, when the electro-optic display device is activated and displaying information, a transparent area remains between the opaque frame and the edges of the opening.

14 Claims, 7 Drawing Sheets

(51) Int. Cl.
*G02F 1/1343* (2006.01)
*G02F 1/1345* (2006.01)
*G04B 19/04* (2006.01)
*G04B 19/06* (2006.01)
*G04G 9/00* (2006.01)
*G04G 17/04* (2006.01)
*H01L 51/52* (2006.01)
*H05K 1/14* (2006.01)
*H05K 1/18* (2006.01)

(52) U.S. Cl.
CPC ...... *G02F 1/13439* (2013.01); *G02F 1/13452* (2013.01); *G02F 1/133308* (2013.01); *G02F 1/133317* (2021.01); *G02F 1/133334* (2021.01); *G04B 19/04* (2013.01); *G04B 19/06* (2013.01); *G04G 9/007* (2013.01); *G04G 17/045* (2013.01); *H01L 51/5203* (2013.01); *H05K 1/147* (2013.01); *H05K 1/189* (2013.01); *H05K 2201/10128* (2013.01); *H05K 2201/10136* (2013.01)

(58) Field of Classification Search
CPC ........... G02F 1/13332; G02F 1/133331; G02F 1/133334
See application file for complete search history.

(56) References Cited

U.S. PATENT DOCUMENTS

| | | | |
|---|---|---|---|
| 2009/0015901 A1* | 1/2009 | Yamada | G02F 1/133502 359/259 |
| 2015/0029829 A1 | 1/2015 | Spadini | |
| 2016/0147091 A1* | 5/2016 | Christmann | G03B 9/02 349/33 |

FOREIGN PATENT DOCUMENTS

| | | |
|---|---|---|
| CN | 167650869 A | 3/2018 |
| CN | 207924382 U | 9/2018 |
| FR | 2 867 285 A1 | 9/2005 |
| JP | 55-66778 A | 5/1980 |
| JP | 57-14778 A | 1/1982 |
| JP | 2002-14343 A | 1/2002 |
| JP | 2002-270377 A | 8/2002 |
| JP | 2005-158619 A | 6/2005 |
| JP | 2017-530511 A | 10/2017 |
| KR | 10-2017-0026007 A | 3/2017 |
| WO | WO 2016/016787 A1 | 2/2016 |

OTHER PUBLICATIONS

Combined Chinese Office Action and Search Report dated Dec. 18, 2020 in Chinese Patent Application No. 201911070454.5 (with English translation), 13 pages.

European Search Report dated Apr. 24, 2019 in European Application 18204699.5, filed on Nov. 6, 2018 (with English Translation of Categories of Cited Documents).

Notice of the Reason for Refusal dated Mar. 9, 2021 in Japanese Patent Application No. 2019-197012 (with English language translation), 6 pages.

* cited by examiner

OBJECT PROVIDED WITH AN ELECTRO-OPTIC DISPLAY DEVICE

CROSS-REFERENCE TO RELATED APPLICATION

This application claims priority to European Patent Application No. 18204699.5 filed on Nov. 6, 2018, the entire disclosure of which is hereby incorporated herein by reference.

TECHNICAL FIELD OF THE INVENTION

The present invention relates to an object provided with an electro-optic display. More specifically, the invention relates to an object such as a timepiece or a smartphone comprising a frame delimiting an opening closed by a crystal beneath a bottom surface of which an electro-optic display device is arranged.

TECHNOLOGICAL BACKGROUND OF THE INVENTION

The present invention relates to the field of electro-optic display devices. The term "electro-optic display device" is understood to mean a display device comprising an optically active element whose optical properties can be modified by applying an electric current or voltage. The display devices that comply with this definition in particular include liquid crystal display devices (also known as LCD devices), organic light emitting diode devices (also known as OLED devices), electrochromic display devices and electrophoretic display devices.

The electro-optic display devices concerned by the present invention conventionally comprise at least one substrate which acts as a support for an optically active element disposed between at least one electrode and one corresponding auxiliary electrode, and whose optical properties can be modified by applying an electric current or voltage between these at least one electrode and auxiliary electrode.

For the purposes of illustration only, the case of a liquid crystal display device can be considered, for example of the twisted nematic (TN) type comprising a front substrate which extends parallel to and remotely from a rear substrate. These front and rear substrates are joined to one another by means of a sealing frame which delimits a sealed enclosure confining the liquid crystal. Electrodes and auxiliary electrodes are structured on the faces facing each other of the front and rear substrates. The application of an electric voltage between a determined electrode and a determined auxiliary electrode makes it possible to modify the optical properties of the liquid crystal at the crossing point between this electrode and this auxiliary electrode.

In order to ensure correct operation of a liquid crystal display device, the electrodes and auxiliary electrodes thereof must be connected to an electronic power and control device at least partially located externally to the display device. For this purpose, one of the two substrates, usually the rear substrate, is provided such that it is larger than the front substrate and this additional surface is used to extend, via electrically-conductive tracks, the auxiliary electrodes supported by the rear substrate outside of the sealing frame of the display device. Similarly, the electrodes supported by the front substrate are transferred to the rear substrate, for example by means of electricity-conducting balls dispersed in the sealing frame. These electrically-conductive balls are in contact, on the one hand with the electrodes, and on the other hand with conductive tracks which run along the rear substrate and allow these electrodes to be extended outside of the sealed enclosure delimited by said sealing frame. Thanks to electrical connectors, the conductive tracks, and thus the electrodes and auxiliary electrodes of the liquid crystal display device can be connected to the external electronic power and control device.

Numerous applications exist today wherein an electro-optic display device such as a liquid crystal display device of the type described briefly hereinabove is sought to be attached. Among the examples that immediately come to mind are timepieces such as wristwatches or smartphones. Such portable objects comprise a frame (also referred to as a "middle part" in the specific case of wristwatches) which delimits an opening that is closed by a crystal. This crystal comprises a top surface directed towards an observer and a bottom surface, opposite the top surface, and to which a liquid crystal display device, for example, is rigidly connected. This liquid crystal display device is intended to display information that will be discernible to the user through the opening delimited by the frame of the portable object.

The problem faced by all designers looking to equip an object, such as a wristwatch or smartphone, with an electro-optic display device directly attached to the bottom surface of the crystal, lies in the need, for understandable aesthetic reasons, to conceal from the user's view all of the electrical connection elements that are required to connect the electro-optic display device to the external electronic power and control device thereof. The most common solution to date for overcoming this problem consists in giving the front substrate via which the electro-optic display device is rigidly connected to the bottom surface of the crystal a dimension that is equal to or substantially the same as that of this crystal, and in providing a rear substrate of a larger dimension than the front substrate in order to obtain a large enough surface area for arranging all of the elements required for the electrical connection of the electro-optic display device to the external electronic power and control device thereof. The portion of the rear substrate that exceeds the dimensions of the crystal extends beneath the frame which is, by definition, opaque, of the portable object and is thus hidden from the user's view.

In these embodiments of the prior art, the active area of the electro-optic display device, i.e. the scope over which such an electro-optic display device can display information, is substantially equal to the scope of the opening delimited by the frame of the object. Objects such as a wristwatch comprising two superimposed display devices of the electro-optic type are already known. More specifically, the upper electro-optic display device is arranged such that, when not displaying information, it is semi-transparent and allows information displayed by the lower electro-optic display device to be viewed. However, this solution appears less suited to the case where the lower display device is not an electro-optic display device. Such is the case, for example, if an object such as a wristwatch is equipped, for example, with a dial above which indicator hands move. More specifically, since the electro-optic display device that is arranged above the hand display device is disposed between two polarisers, less than 50% of the external light that falls on this electro-optic display device will penetrate the inside of the watch case, such that the dial and the hands moving thereabove will appear dark and difficult to perceive by the user. There is thus a need in the prior art for an object, in particular a portable object such as a wristwatch or a smartphone, comprising a frame that delimits an opening through which can be viewed not only the information displayed by the electro-optic display device, but also the information displayed by a second display device arranged beneath the electro-optic display device, while hiding from the user's view the construction elements and electrical connection elements, whose view thereof would be aesthetically detrimental for the object.

SUMMARY OF THE INVENTION

The purpose of the present invention is thus to fulfil the aforementioned and other needs by providing an object, in particular a portable object such as a timepiece or a smartphone, provided with a first electro-optic display device and a second display device arranged beneath the electro-optic display device, the information displayed respectively by the first electro-optic display device and by the second display device being discernible through the opening delimited by the frame of the object. It goes without saying that all of the elements required for the electrical connection of the first electro-optic display device to the external electronic power and control device thereof must remain indiscernible to the user.

For this purpose, the present invention relates to an object, in particular a portable object such as a timepiece or smartphone, this object comprising an electro-optic display device externally delimited by a contour and which is provided with an optically active element, whose optical properties can be modified by applying an electric voltage or current between at least one electrode and one corresponding auxiliary electrode, between which the optically active element is disposed, the object further comprising a frame which delimits an opening closed by a crystal, the crystal comprising a top surface and a bottom surface beneath which the electro-optic display device is arranged, the object further comprising an external electronic power and control device in addition to elements for the electrical connection of the electro-optic display device to the external electronic power and control device, the crystal being provided with an opaque frame which is made remotely from the edges of the opening and which covers the contour of the electro-optic display device so as to conceal the electrical connection elements, the electro-optic display device defining an active display area which is circumscribed by the opaque frame, such that, even when the electro-optic display device is activated and displays information, a transparent area remains between the opaque frame and the edges of the opening.

According to one specific embodiment of the invention, the object comprises a second device for displaying information arranged beneath the electro-optic display device and at least partially visible through the transparent area.

Thanks to these features, the present invention provides an object, in particular a portable object such as a wristwatch or a smartphone, provided with an electro-optic display device, an active display area of which, defined by an optically active element whose optical properties can be modified by applying an electric voltage or current, is delimited by an opaque frame which conceals the electrical connection elements of the electro-optic display device. As a result, even when the active display area is displaying information, a transparent area devoid of any displayed information remains between the opaque frame and the edge of the opening delimited by the middle part of the object, which transparent area can be used to make visible, for example, a second display device disposed beneath the electro-optic display device.

One example illustrating the possibilities procured by the present invention is that of a wristwatch equipped with an electro-optic display device according to the present invention and further comprising a dial provided with hands arranged beneath the electro-optic display device. Thanks to the features of the invention, the user of the wristwatch thus simultaneously views through the crystal of his/her watch the digital information displayed by the active area of the electro-optic display device, and the analogue information displayed by the hands that move over the dial. Thanks to the invention, a hybrid watch is thus obtained, provided with a "screen"-type display and an analogue display of the "hand" type, the appearance thereof being original and innovative. However, it should be noted that the present invention is not limited to the use of an analogue display device disposed beneath the electro-optic display device, and that a first and a second electro-optic display device can very well be combined with one another, the second electro-optic display device thus being adapted such that it displays information in the transparent area located between the edge of the middle part and the opaque frame. There is thus the possibility of choosing to activate only the first electro-optic display device attached beneath the crystal, or only the second electro-optic display device disposed beneath the first, or to activate the first and second electro-optic display devices simultaneously.

BRIEF DESCRIPTION OF THE FIGURES

Other characteristics and advantages of this invention will be better understood upon reading the following detailed description of one example embodiment of a portable object of the wristwatch type according to the invention, said example being provided for the purposes of illustration only and not intended to limit the scope of the invention, given with reference to the accompanying drawing, wherein.

DETAILED DESCRIPTION OF ONE EMBODIMENT OF THE INVENTION

The present invention was drawn from the general inventive idea consisting of disposing an electro-optic display device beneath the bottom surface of a crystal sealing an opening delimited by a middle part of an object, in particular a portable object such as a wristwatch or a smartphone. The originality of the object according to the invention lies in the fact that the crystal is intended to be provided with an opaque frame which extends remotely from the edges of the opening delimited by the middle part and which covers the electro-optic display device at the periphery thereof, so as to conceal the elements required to electrically connect the electro-optic display device to the external electronic power and control device thereof. Since the active display area of the electro-optic display device is circumscribed by the opaque frame, a transparent area devoid of any displayed information remains between the opaque frame and the edge of the opening delimited by the middle part of the object. As a result, even when the electro-optic display device is activated and is displaying information, a transparent area devoid of any displayed information remains between the active display area thereof and the edges of the middle part of the object, through which transparent area, for example, a second device for displaying information can be viewed, arranged beneath the electro-optic display device. This second device for displaying information can be of any kind: it can simply be a decorative pattern; it can also be a second electro-optic display device. According to a special embodiment of the invention, the second display device is a dial above which hands move. Thanks to the invention, a hybrid watch is thus obtained, provided with a "screen"-type display and an analogue display, the appearance thereof being original and innovative.

The present invention will now be described with reference to a portable object of the wristwatch type equipped with an electro-optic display device of the liquid crystal display device type. It goes without saying that this example is provided for illustrative, non-limiting purposes only and that the object can be something other than a timepiece. Broadly speaking, it concerns any type of object, such as a telephone or laptop comprising a middle part that delimits an opening closed by a crystal through which information displayed by the electro-optic display device is discernible. Similarly, the choice of electro-optic display device is not limited to liquid crystal display devices and in particular extends to display devices of the organic light emitting diode type, as well as to electrophoretic display devices and to electrochromic display devices. More specifically, these different types of electro-optic display devices all comprise at least one substrate which acts as a support for an optically active element (for example twisted nematic or super-twisted nematic or vertical alignment liquid crystal for a liquid crystal display device, active hole-injection, hole-transport and electron-transport layers for an organic light emitting diode display device, black and white particles or colour particles dispersed in a fluid in the case of electrophoretic display devices, liquid or solid electrolyte in the case of electrochromic display devices), and sets of electrodes and auxiliary electrodes used to modify the optical properties of the optically active element by applying an electric current or voltage.

It should be noted that, as per the present invention, the term "active display area of an electro-optic display device" is understood to mean the useful portion of the front surface of the electro-optic display device on which information elements can be displayed. By way of example, in the case of an electro-optic display device of the twisted nematic liquid crystal type, two front and rear substrates are present, which extend parallel to and remotely from one another, and which are joined to one another by a sealing frame which delimits a sealed enclosure for confining the liquid crystal. A front polariser film is attached to the top of the front substrate and the polarisation direction thereof forms a 90° angle with the polarisation direction of a rear polariser film attached to the bottom of the rear substrate. In such a case, the polarisers are referred to as crossed. In this case, the information displayed by the electro-optic display device in the active display area thereof will appear dark against a transparent background. For the active display area to appear opaque, the rear polariser film can be combined with a reflector or an opaque backlighting device can be provided beneath the rear substrate. Instead of the backlighting device, an opaque film can also be used.

The polarisers can also be parallel, i.e. the polarisation directions thereof can be parallel to one another. Yet another embodiment consists of combining a circular polariser attached to the top of the front substrate with a metal reflector arranged inside the liquid crystal display device, on the top of the rear substrate. The active display area is thus defined as the volume of liquid crystal sandwiched between the front polariser film and the rear polariser film or between the circular polariser film and the metal reflector.

Figure 1:
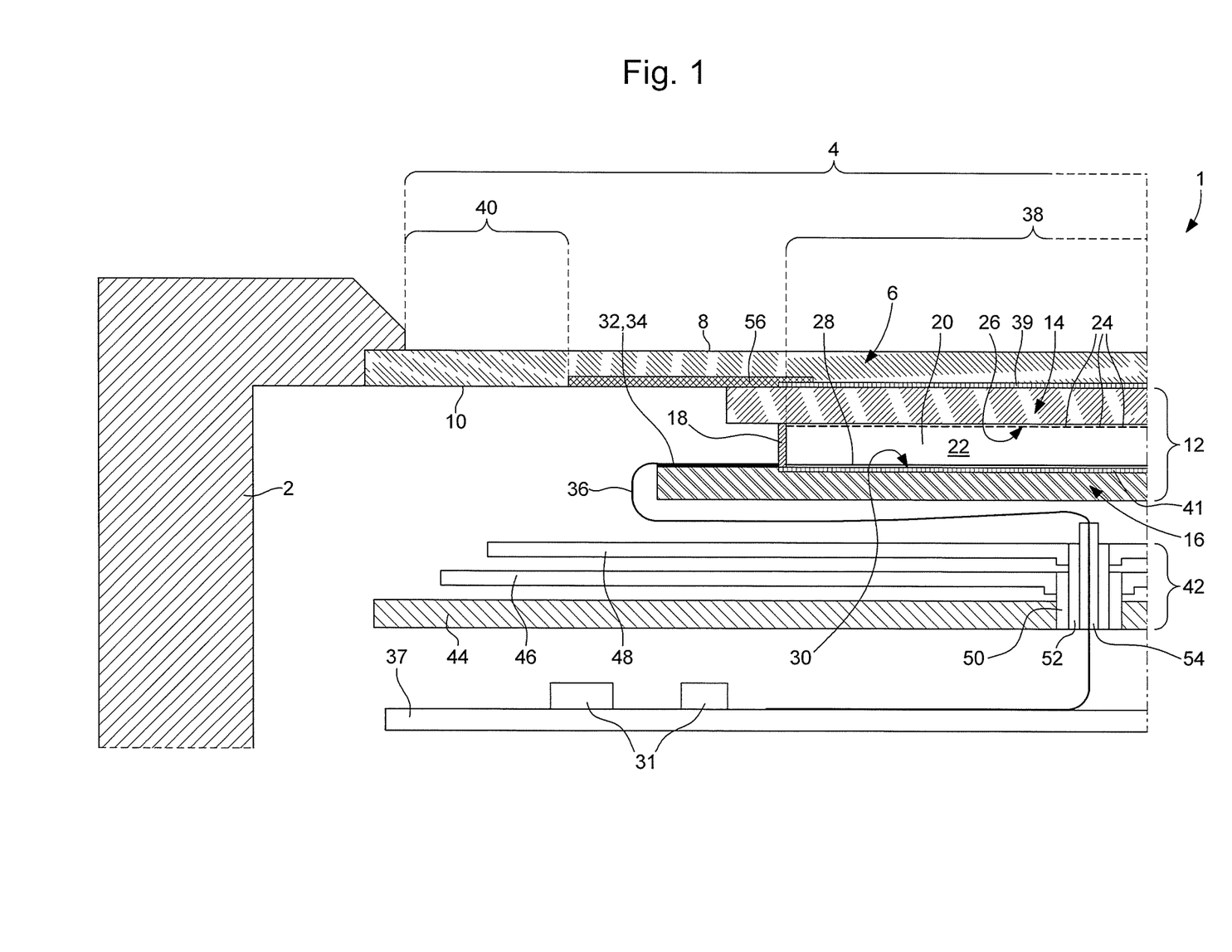
FIG. 1 is a partial sectional view of a first embodiment of a watch case according to the invention, a middle part thereof delimiting an opening closed by a crystal to the bottom surface of which an electro-optic display device of the liquid crystal display device type is rigidly connected, a second display device comprising a first pipe supporting a first hand and a second pipe arranged concentrically inside the first pipe and supporting a second hand being disposed beneath the electro-optic display device, this electro-optic display device being connected to an external electronic power and control device via a flexible printed circuit (or FPC), which is passed in a hollow tube arranged inside the second pipe.

Denoted as a whole by the general reference numeral 1, the wristwatch case shown only partially in a sectional view in FIG. 1 comprises a middle part 2. This middle part 2 delimits an opening 4 that is, for example, circular, and closed in a perfectly sealed manner by a crystal 6. This crystal 6 comprises a top surface 8 directed towards the user and a bottom surface 10, opposite the top surface 8, directed towards the interior of the wristwatch case 1. An electro-optic display device, in this instance a liquid crystal display device 12, comprises a transparent front substrate 14 attached by any suitable means to the bottom surface 10 of the crystal 6.

This front substrate 14 extends parallel to and remotely from a rear substrate 16 that is also transparent. The front substrate 14 and the rear substrate 16 are joined to one another by means of a sealing frame 18 which delimits a sealed enclosure 20 for confining a liquid crystal 22. The liquid crystal display device 12 is, for example, rigidly connected by lamination by means of an optical clear adhesive (OCA) to the bottom surface 10 of the crystal 6. The optical clear adhesive has the advantage of preventing parasitic optical reflection issues at the interface between the crystal 6 and the liquid crystal display device 12. Electrodes 24 made of an electrically-conductive, transparent material such as indium-tin oxide (ITO) are structured on a bottom face 26 of the front substrate 14 of the liquid crystal display device 12, whereas auxiliary electrodes 28, also made of an electrically-conductive, transparent material, are structured on a top face 30 of the rear substrate 16. It should be noted that, in the case of a liquid crystal display device of the reflective type, the auxiliary electrodes can be made of an electrically-conductive material having a mirror appearance. The electrodes 24 and the auxiliary electrodes 28 are arranged on either side of the layer of liquid crystal 22. The application of a suitable electric voltage between a given electrode and a given auxiliary electrode modifies the optical properties of the liquid crystal 22 at the crosspoint between the electrode and the auxiliary electrode considered.

The dimensions of the front substrate 14 of the liquid crystal display device 12 are less than those of the crystal 6. The dimensions of the rear substrate 16 are greater than those of the front substrate 14 but also smaller than those of the crystal 6. It must be remembered that the electrodes 24 and the auxiliary electrodes 28 must be connected to an external electronic power and control device 31. For this purpose, the rear substrate 16 is designed such that it is larger than the front substrate 14 and this additional surface area is used to extend, via first electrically-conductive tracks 32 made of an electrically-conductive, transparent material such as indium-tin oxide (ITO), the auxiliary electrodes 28 supported by the rear substrate 16 outside of the sealing frame 18 of the liquid crystal display device 22. Similarly, the electrodes 24 supported by the front substrate 14 are transferred to the rear substrate 16, for example by means of electrically-conductive balls and dispersed in the body of the sealing frame 18. These electrically-conductive balls place the electrodes 24 in contact with second conductive tracks 34 which run along the rear substrate 16 and allow these electrodes 24 to be extended outside of the sealed enclosure delimited by the sealing wall 18. Thanks to a flexible printed circuit (FPC) 36, the conductive tracks 32, 34 can be connected, and as a result, the electrodes 24 and the auxiliary electrodes 28 of the liquid crystal display device 12 can be connected to the external electronic power and control device 31 arranged on a printed circuit board 37.

As stated hereinabove, the active display area 38 of the liquid crystal display device 12 is defined by the volume of the liquid crystal 22 confined inside the perimeter of the sealing frame 18 and which is comprised between an upper polariser 39 and a lower polariser 41. These polarisers 39, 41 can be crossed, i.e. the polarisation directions thereof form a right angle, or parallel, i.e. the polarisation directions thereof extend parallel to one another. According to the invention, and as shown in FIG. 1 accompanying this patent application, the scope of this active display area 38 is less than the surface area of the crystal 6. As a result, even when the liquid crystal display device 12 is activated and is displaying information, a transparent area 40 devoid of any displayed information remains between the active display area 38 thereof and the edges of the opening 4 delimited by the middle part 2 of the wristwatch, through which transparent area a second device 42 for displaying information can be viewed, arranged beneath the liquid crystal display device 12. This second device 42 for displaying information can be of any kind: it can simply be a decorative pattern; it can also be a second electro-optic display device. According to a special embodiment of the invention shown in FIG. 1, the second display device 42 arranged beneath the liquid crystal display device 12 is formed by a dial 44 above which first and second hands 46 and 48 move. Thanks to the invention, a hybrid watch is thus obtained, provided with a "screen"-type display and an analogue display, the appearance thereof being original and innovative.

The first hand 46 is supported by a first pipe 50, and the second hand 48 is supported by a second pipe 52 arranged concentrically inside the first pipe 50. A hollow tube 54 is arranged inside the second pipe 52. This hollow tube 54 is intended to allow for the passage of the flexible printed circuit 36 which connects the conductive tracks 32, 34 and, as a result, the electrodes 24 and the auxiliary electrodes 28 of the liquid crystal display device 12, to the external electronic power and control device 31 arranged on the printed circuit board 37 which is advantageously disposed beneath the second display device 42. The presence of the hollow tube 54 in which the flexible printed circuit 36 is passed prevents this flexible printed circuit 36 from hindering the rotation of the first and second hands 46, 48 and cannot be perceived through the transparent area 40.

According to the invention, the crystal 6 is provided with an opaque frame 56 which is made remotely from the edges of the opening 4 and which defines the effective surface through which the information displayed by the liquid crystal display device 12 is discernible to the user. The opaque frame 56 covers the liquid crystal display device 12 at the periphery thereof so as to conceal the electrical connection elements, in particular the flexible printed circuit 36, as well as the sealing frame 18 and the edges of the upper polariser 39 and lower polariser 41. The second display device 42 thus remains partially visible through the transparent area 40 which is externally bordered by the edges of the middle part 2 and internally bordered by the opaque frame 56. The term "opaque frame" is understood to mean a frame which does not allow light to pass and thus which fully conceals the electrical connection elements of the liquid crystal display device 12 from the user's view. For the purposes of illustration only, the opaque frame 56 can be a coat of paint deposited by pad-printing or screen-printing. Another possibility involves machining a groove in the crystal 6, the geometry of which groove corresponds to the desired geometry of the opaque frame 56, and filling this groove with an enamel deposit. The opaque frame 56 can also be made by means of a thin metal layer or laminated film on the crystal 6.

In the remainder of this document, identical elements to those described with reference to FIG. 1 will be denoted using the same reference numerals.

Figure 2:
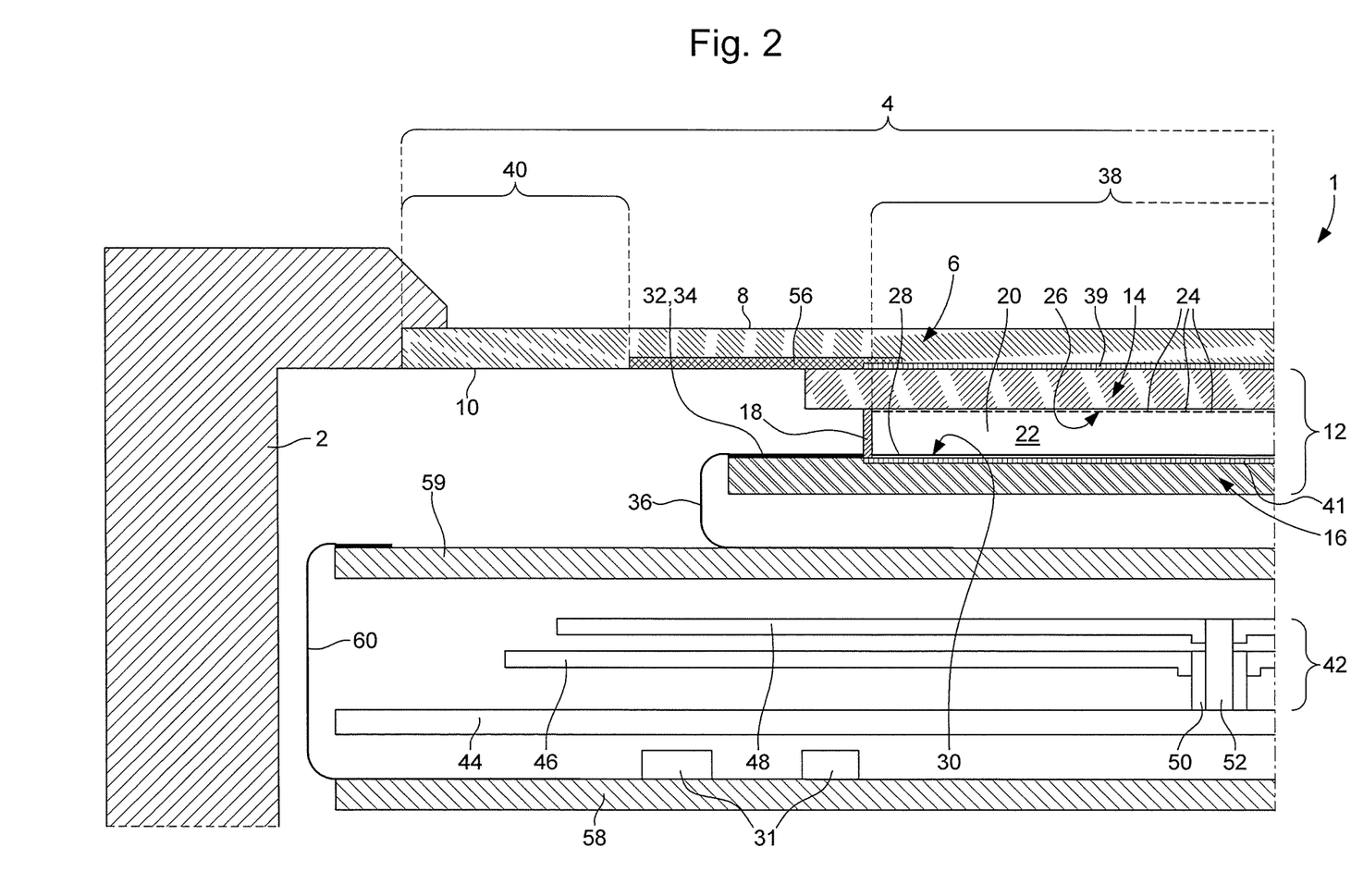
FIG. 2 is a partial sectional view of a second embodiment of a watch case according to the invention, wherein the electro-optic display device is connected by means of a first and of a second flexible printed circuit to the external electronic power and control device thereof arranged beneath the second display device via a transparent printed circuit board arranged beneath the electro-optic display device, the second display device being arranged beneath the transparent printed circuit board.

In FIG. 2, the conductive tracks 32, 34 and, as a result, the electrodes 24 and the auxiliary electrodes 28 of the liquid crystal display device 12, are connected to the external electronic power and control device 31 which is arranged on a printed circuit board 58 disposed beneath the dial 44 thanks to a first flexible printed circuit 36 which extends between the liquid crystal display device 12 and a transparent printed circuit board 59 disposed beneath the liquid crystal display device 12 and on which transparent conductive tracks are structured, for example made of indium-tin oxide (or ITO), whereas a second flexible printed circuit 60 connects the transparent printed circuit board 59 to the printed circuit board 58 on which the external electronic power and control device 31 is arranged. It should be understood that the presence of the opaque frame 56, of the active display area 38 of the liquid crystal display device 12 and of the dial 44 is used to conceal from the user's view the flexible printed circuit 36, the different components of the external electronic power and control device 31 and more generally all electrical connection elements. The second display device 42 which, in the example shown in a non-limiting manner, comprises a dial 44 above which first and second hands 46 and 48 move, is arranged beneath the printed circuit board 58 such that it is partially visible through the transparent area 40.

Figure 3:
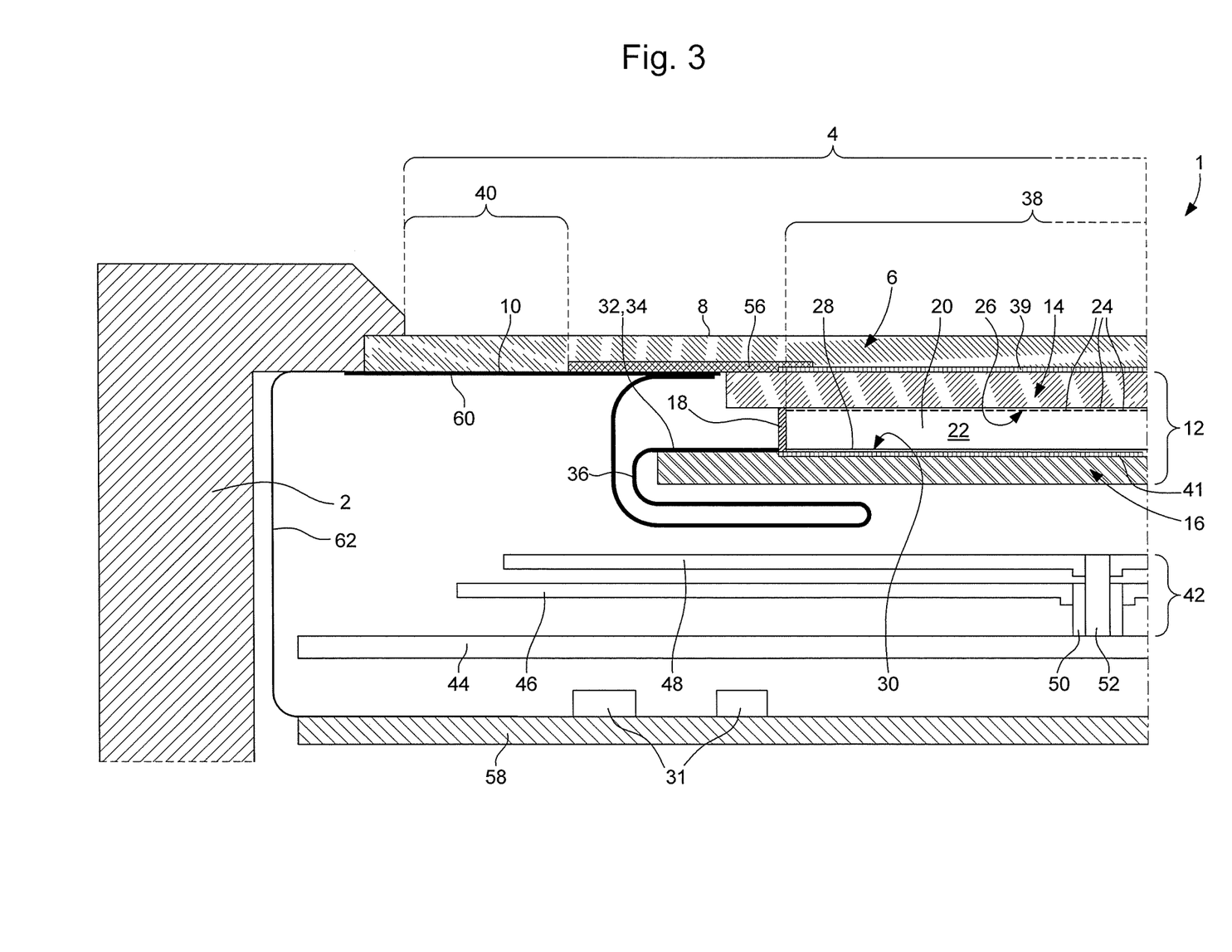
FIG. 3 is a partial sectional view of a third embodiment of a watch case according to the invention, wherein transparent conductive tracks are structured on the bottom surface of the crystal, the electro-optic display device being connected to these transparent conductive tracks by means of a first flexible printed circuit, the transparent conductive tracks being themselves connected by means of a second flexible printed circuit to the external electronic power and control device of the electro-optic display device, a second display device being disposed beneath the electro-optic display device.

In FIG. 3, transparent conductive tracks 60 are structured on the bottom surface 10 of the crystal 6. According to an alternative embodiment, the transparent conductive tracks 60 are structured on a flexible film which is laminated against the inner surface 10 of the crystal 6. On the other hand, the description above shows that the electrodes 24 supported by the front substrate 14 of the liquid crystal display device 12 are transferred to the rear substrate 16 of the same liquid crystal display device 12. Using a first flexible printed circuit 36 cleverly concealed by the opaque frame 56 and connected to the conductive tracks 32, 34 supported by the top face 30 of the rear substrate 16 of the liquid crystal display device 12, the electrodes 24 and the auxiliary electrodes 28 are connected to the transparent conductive tracks 60. Then, by means of a second flexible printed circuit 62 attached to the bottom surface 10 of the crystal 6 and concealed by the middle part 2, the transparent conductive tracks 60 are connected to the external electronic power and control device 31 of the liquid crystal display device 12.

Figure 4:
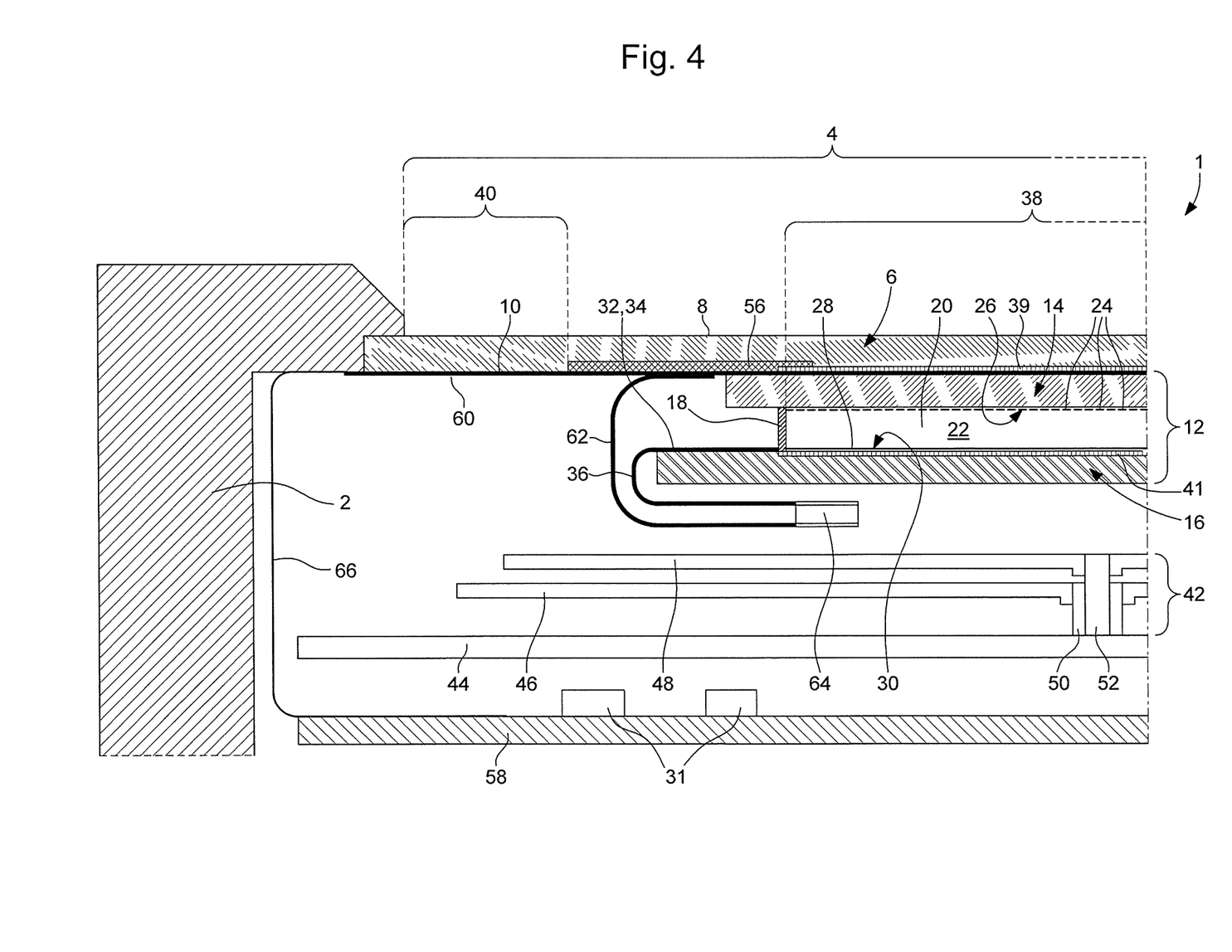
FIG. 4 is a partial sectional view of a fourth embodiment of a watch case according to the invention, which differs from the embodiment shown in FIG. 3 only in that the first flexible printed circuit is divided into two parts connected to one another by means of an electrical connector in order to facilitate assembly.

In FIG. 4, a first flexible printed circuit 36 connected to the conductive tracks 32, 34 supported by the top face 30 of the rear substrate 16 of the liquid crystal display device 12 allows the electrodes 24 and the auxiliary electrodes 28 to be connected to the transparent conductive tracks 60 structured on the bottom surface 10 of the crystal 6 via a second flexible printed circuit 62 with interposition of an electrical connector 64 which acts to facilitate assembly operations between the flexible printed circuits 36 and 60. Then, by means of a third flexible printed circuit 66 attached to the bottom surface 10 of the crystal 6 and concealed by the middle part 2, the transparent conductive tracks 60 are connected to the external electronic power and control device 31 of the liquid crystal display device 12. It should be noted that the flexible printed circuits 36 and 62 in addition to the electrical connector 64 are cleverly concealed by the opaque frame 56 and the liquid crystal display device 12.

Figure 5:
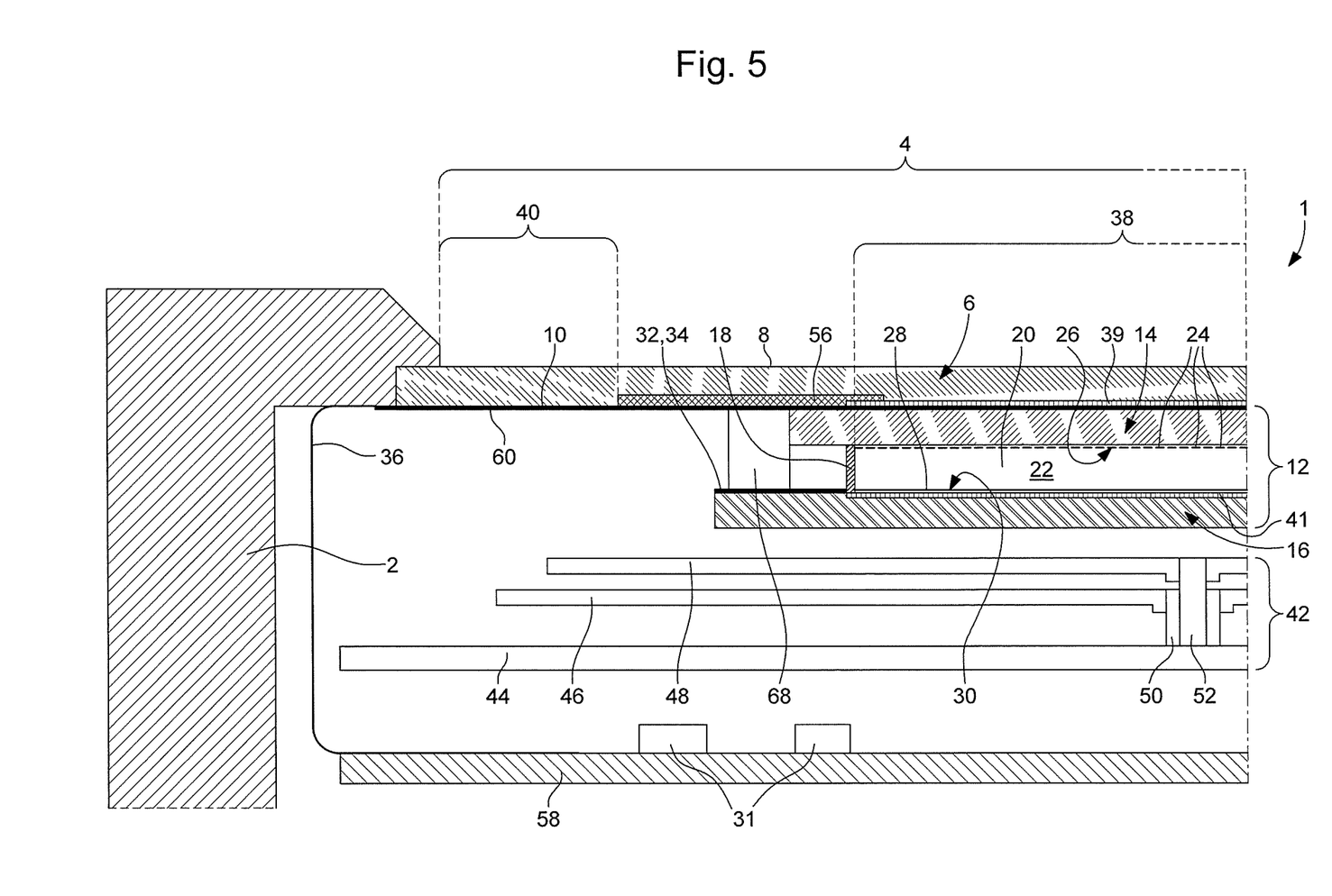
FIG. 5 is a partial sectional view of a fifth embodiment of a watch case according to the invention, wherein a flexible connector formed by an alternation of electrically-conductive sheets and of insulating elastomer sheets allows an electro-optic display device to be connected to transparent conductive tracks structured on the bottom surface of the crystal, a flexible printed circuit allowing the transparent conductive tracks to be connected to an external power and control device of the electro-optic display device, a second display device being disposed beneath the electro-optic display device.

In FIG. 5, a flexible connector 68 formed by an alternation of electrically-conductive sheets and of insulating elastomer sheets, in particular known under the trade name Zebra® connector, is disposed between the rear substrate 16 and the crystal 6. Other embodiments of the flexible connector 68 are also available, such as a silicon matrix in which metal wires are embedded, all of which are oriented in the same direction. Cleverly concealed by the opaque frame 56, this flexible connector 68 allows the conductive tracks 32, 34 supported by the top face 30 of the rear substrate 16 of the liquid crystal display device 12, and thus the electrodes 24 and the auxiliary electrodes 28, to be connected to the transparent conductive tracks 60 structured on the bottom surface 10 of the crystal 6. Subsequently, a flexible printed circuit 36 attached to the bottom surface 10 of the crystal 6 and concealed by the middle part 2 allows the liquid crystal display device 12 to be connected to the external electronic power and control device 31 thereof.

Figure 6:
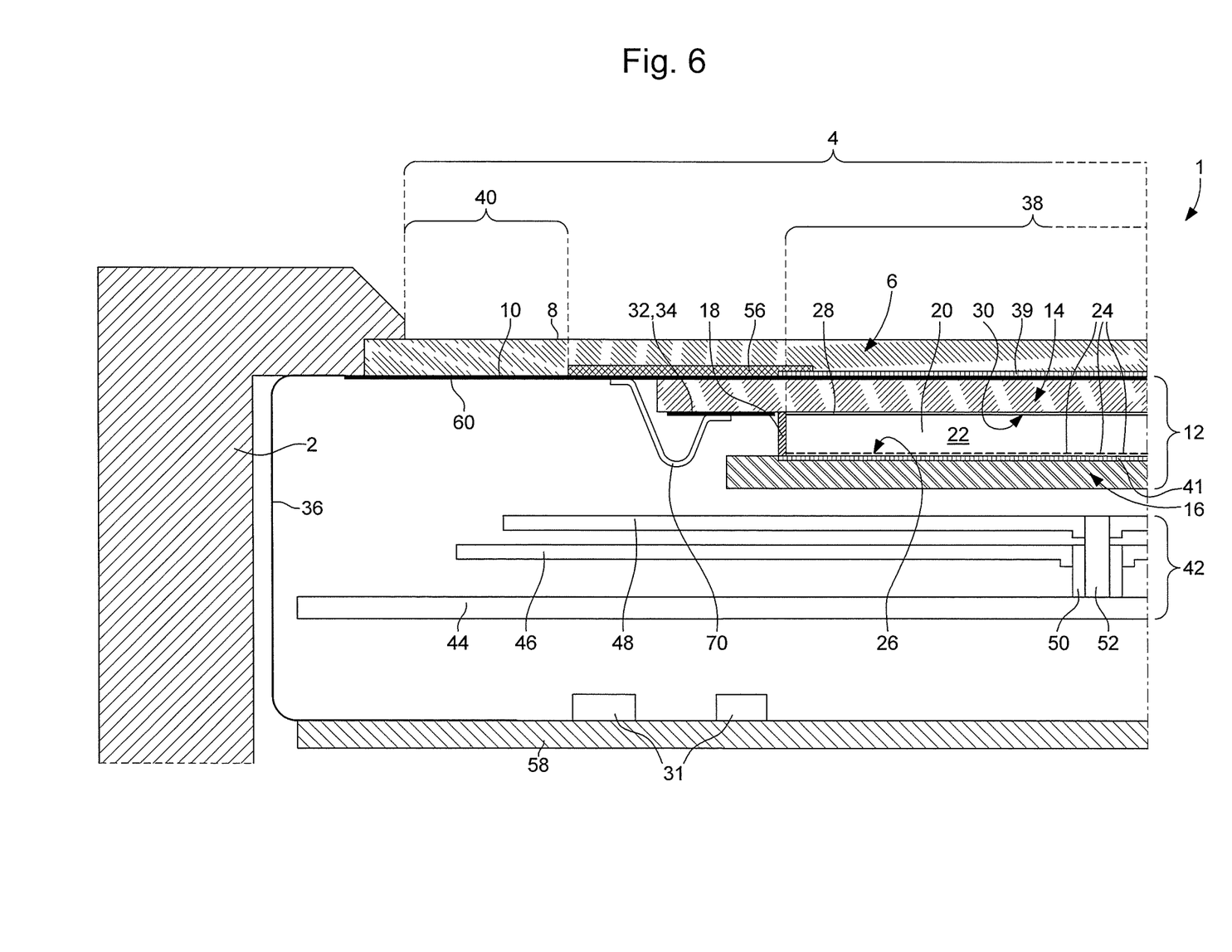
FIG. 6 is a partial sectional view of a sixth embodiment of a watch case according to the invention, wherein the electro-optic display device is attached via the front substrate thereof to the bottom surface of the crystal and is connected by a wire-based connection method to transparent conductive tracks structured on the bottom surface of the crystal, a flexible printed circuit allowing the transparent conductive tracks to be connected to the external power and control device of the electro-optic display device, a second display device being disposed beneath the electro-optic display device.

In FIG. 6, the liquid crystal display device 12 is attached to the bottom surface 10 of the crystal 6 by the front substrate 14 thereof, which is designed such that it is larger than the rear substrate 16, this additional surface area being used to extend, via first electrically-conductive tracks 32, the electrodes 24 supported by the front substrate 14 outside of the sealing wall 18. Similarly, the auxiliary electrodes 28 supported by the rear substrate 16 are transferred to the front substrate 14, for example by means of electrically-conductive balls and dispersed in the body of the sealing frame 18. These electrically-conductive balls place the auxiliary electrodes 28 in contact with second conductive tracks 34 which run along the front substrate 14 and allow these electrodes 24 to be extended outside of the sealed enclosure delimited by the sealing wall 18. This allows, for the mounted assembly formed by the liquid crystal display device 12 and the crystal 6, the conductive tracks 32, 34 supported by the front substrate 14 of the liquid crystal display device 12, and thus the electrodes 24 and the auxiliary electrodes 28, to be connected, via a wire-based connection method known as wire bonding, to the transparent conductive tracks 60 structured on the bottom surface 10 of the crystal 6. The connecting wires 70 are cleverly concealed by the opaque frame 56. The connecting wires 70 can be replaced by a flexible printed circuit. Finally, a flexible printed circuit 36 attached to the bottom surface 10 of the crystal 6 and concealed by the middle part 2 allows the liquid crystal display device 12 to be connected to the external electronic power and control device 31 thereof.

Figure 7:
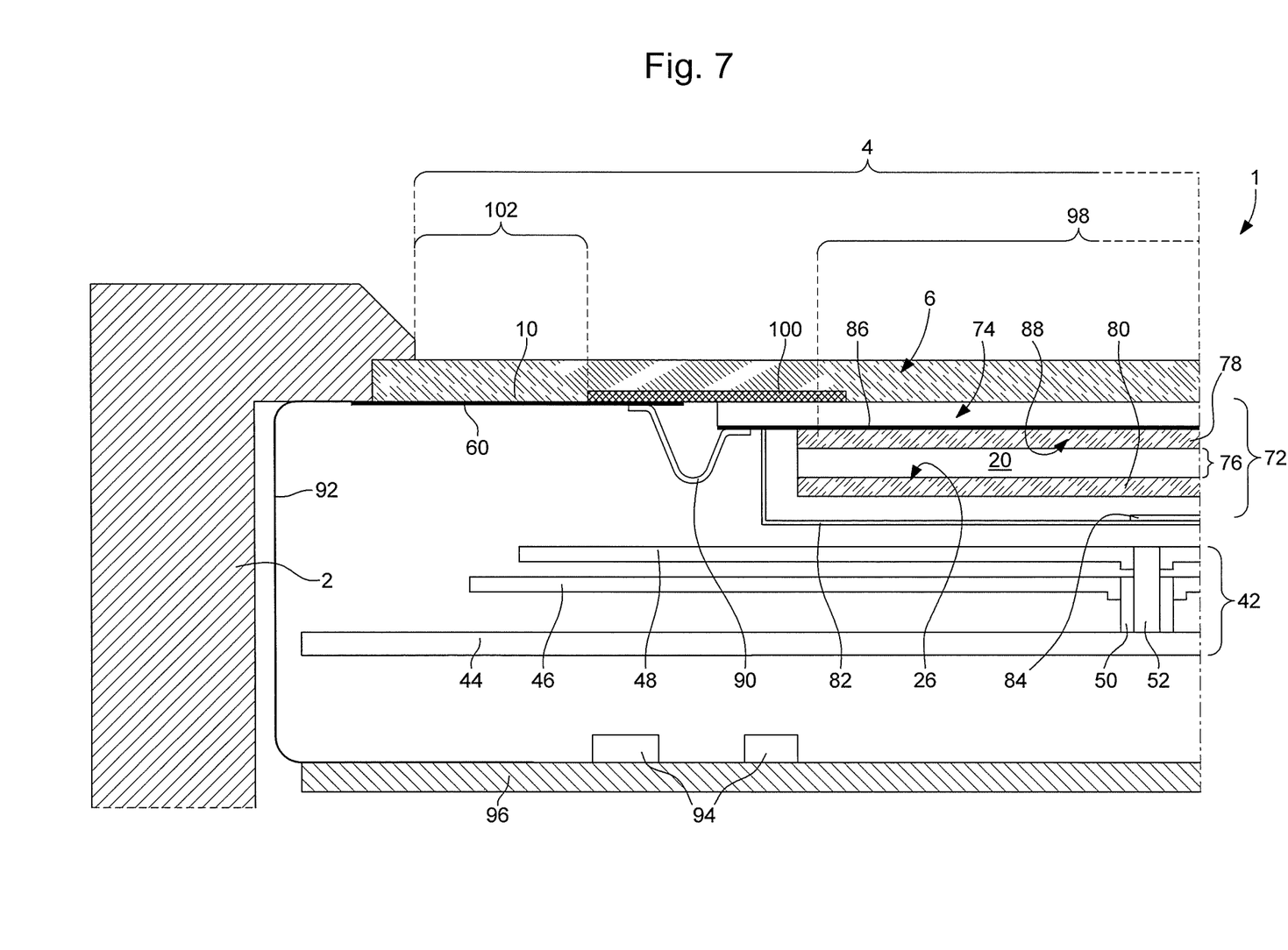
FIG. 7 is a view similar to that of FIG. 6, wherein the electro-optic display device is of the OLED type.

It is evident that this invention is not limited to the embodiments described above and that various simple alternatives and modifications can be considered by one of ordinary skill in the art without departing from the scope of the invention as defined by the accompanying claims. In particular, the present invention can be applied to an organic light emitting diode (OLED) display device as shown in FIG. 7. Denoted as a whole by the general reference numeral 72, this OLED display device comprises a transparent substrate 74 that acts as a support for a stack of organic layers 76 sandwiched between an anode 78 and a cathode 80. The set of layers of the OLED display device 72 is protected from humidity by a cover 82 which defines a sealed enclosure wherein a humidity-absorbing device 84 is arranged. Alternatively, the set of layers of the OLED display device 72 can be protected by the deposition of thin films. These thin films can be deposited by atomic layer deposition (ALD). The OLED display device is attached to the bottom surface 10 of the crystal 6 by the transparent substrate 74 thereof. Conductive tracks 86 structured on the bottom face 88 of the transparent substrate 74 extend outside of the sealed enclosure delimited by the cover 82. This allows, for the mounted assembly formed by the OLED display device 72 and the crystal 6, the conductive tracks 86 supported by the transparent substrate 74 of the OLED display device 72, to be connected, via a wire-based connection method known as wire bonding, to the transparent conductive tracks 60 structured on the bottom surface 10 of the crystal 6. The connecting wires 90 are cleverly concealed by the opaque frame 56. The connecting wires 90 can be replaced by a flexible printed circuit. Finally, a flexible printed circuit 92 attached to the bottom surface 10 of the crystal 6 and concealed by the middle part 2 allows the OLED display device 72 to be connected to the external electronic power and control device 94 thereof arranged on a printed circuit board 96. The active display area 98 of the OLED display device 72 is defined by the overlap area between the anode 78 and the cathode 80. This active display area 98 has a metallic appearance in the absence of a circular polariser, and will appear dark if such a circular polariser is used. In accordance with the invention, an opaque frame 100 is provided on the top surface 8 of the crystal 6, remotely from the edges of the opening 4, and covers the active display area 98 of the OLED display device 72 at the periphery thereof in order to delimit the effective surface through which the information displayed by the OLED display device 72 is discernible to the user. A transparent area 102 devoid of any displayed information thus remains between the edges of the opening 4 and the outer contour of the opaque frame 100, through which transparent area a second display device 42 can be viewed, such as a dial 44 above which first and second hands 46, 48 move, arranged beneath the OLED display device 72. In the example shown in FIG. 7, the OLED display device 72 is of the bottom emission type, i.e. light emerges from the OLED display device 72 through the transparent substrate 74. In the case where the OLED display device 72 is of the top emission type, i.e. the case where light emerges from the OLED display device 72 on the opposite side to the transparent substrate 74, the OLED display device 72 can be designed to be attached to the bottom surface 10 of the crystal 6 via the cover 82 thereof. In the case where the OLED display device 72 is protected from humidity by the deposition of thin films over the entirety of the layers thereof, the OLED display device 72 is attached to the bottom surface 10 of the crystal 6 via the thin films.

NOMENCLATURE

1. Wristwatch case
2. Middle part
4. Opening
6. Crystal
8. Top surface
10. Bottom surface
12. Liquid crystal display device
14. Front substrate
16. Rear substrate
18. Sealing frame
20. Sealed enclosure
22. Liquid crystal
24. Electrodes
26. Bottom face
28. Auxiliary electrodes
30. Top face
31. External electronic power and control device
32. First electrically-conductive tracks
34. Second electrically-conductive tracks
36. Flexible printed circuit
37. Printed circuit board
38. Active display area
39. Upper polariser
40. Transparent area
41. Lower polariser
42. Second display device
44. Dial
46, 48. First and second hands
50. First pipe
52. Second pipe
54. Hollow tube
56. Opaque frame
58. Printed circuit board
59. Transparent printed circuit board
60. Transparent conductive tracks
62. Second flexible printed circuit
64. Electrical connector
66. Third flexible printed circuit
68. Flexible connector
70. Connecting wires
72. OLED display device
74. Transparent substrate
76. Stack of organic layers
78. Anode
80. Cathode
82. Cover
84. Humidity absorbing device
86. Conductive tracks
88. Bottom face
90. Connecting wires
92. Flexible printed circuit
94. External electronic power and control device
96. Printed circuit board
98. Active display area
100. Opaque frame
102. Transparent area

The invention claimed is:

1. An object comprising:
an electro-optic display device externally delimited by a contour and which is provided with an optically active element, whose optical properties can be modified by applying an electric voltage or current between at least one electrode and one corresponding auxiliary electrode, between which the optically active element is disposed,
a middle part which delimits an opening closed by a crystal, the crystal comprising a top surface and a bottom surface beneath which the electro-optic display device is arranged,
an external electronic power and control device in addition to elements for the electrical connection of the electro-optic display device to the external electronic power and control device, the crystal being provided with an opaque frame which is made remotely from inner edges of the opening and which covers the contour of the electro-optic display device so as to conceal the electrical connection elements, the electro-optic display device defining an active display area which is delimited by the opaque frame, such that, even when the electro-optic display device is activated and displays information, the crystal includes a transparent area that remains directly between an outer edge of the opaque frame and the inner edges of the opening, said transparent area being directly in contact with said outer and inner edges.

2. The object according to claim 1, further comprising a second display device arranged beneath the electro-optic display device and at least partially visible through the transparent area.

3. The object according to claim 2, wherein the second display device comprises a dial above which first and second hands move.

4. The object according to claim 3, wherein the electro-optic display device is an OLED display device.

5. The object according to claim 4, wherein the OLED display device is of the bottom emission type and comprises a transparent substrate via which it is attached to the bottom surface of the crystal, this transparent substrate acting as a support for a stack of organic layers protected from humidity by a cover or by thin films that define a sealed enclosure, conductive tracks structured on a bottom face of the transparent substrate extending outside of the sealed enclosure and being connected by connecting wires to transparent conductive tracks structured on the bottom surface of the crystal which are themselves connected, via a flexible printed circuit, to an external electronic power and control device of the OLED display device.

6. The object according to claim 4, wherein the OLED display device is of the top emission type and comprises a transparent substrate acting as a support for a stack of organic layers protected from humidity by a cover or by thin films that define a sealed enclosure, the OLED display device being attached to the bottom surface of the crystal via the cover thereof or via the thin films thereof.

7. The object according to claim 3, wherein the electro-optic display device is a liquid crystal display device.

8. The object according to claim 7, wherein the first hand is supported by a first pipe, and the second hand is supported by a second pipe arranged concentrically inside the first pipe, the liquid crystal display device being connected to the external electronic power and control device via a flexible printed circuit which is passed in a hollow tube arranged inside the second pipe.

9. The object according to claim 7, wherein the liquid crystal display device is connected to the external electronic power and control device which is arranged on a printed circuit board disposed beneath the dial thanks to a first flexible printed circuit which extends between the liquid crystal display device and a transparent printed circuit board disposed beneath the liquid crystal display device, a second flexible printed circuit connecting the transparent printed circuit board to the printed circuit board on which the external electronic power and control device is arranged.

10. The object according to claim 7, wherein transparent conductive tracks are structured on the bottom surface of the crystal, the liquid crystal display device being connected to these transparent conductive tracks with a first flexible printed circuit, the transparent conductive tracks being themselves connected with a second flexible printed circuit to the external electronic power and control device of the liquid crystal display device, which is concealed by the middle part, the second display device being disposed beneath the liquid crystal display device.

11. The object according to claim 7, wherein transparent conductive tracks are structured on the bottom surface of the crystal, the liquid crystal display device being connected to these transparent conductive tracks with a first flexible printed circuit and of a second flexible printed circuit connected to the first flexible printed circuit with an electrical connector, a third flexible printed circuit connecting the transparent conductive tracks to the external electronic power and control device of the liquid crystal display device, the second display device being disposed beneath the liquid crystal display device.

12. The object according to claim 7, wherein the liquid crystal display device is connected to transparent conductive tracks structured on the bottom surface of the crystal with a flexible connector formed by an alternation of electrically-conductive sheets and of insulating elastomer sheets, a flexible printed circuit allowing the transparent conductive tracks to be connected to an external electronic power and control device of the liquid crystal display device, the second display device being disposed beneath the liquid crystal display device.

13. The object according to claim 1, wherein the object is a timepiece or smartphone.

14. The object according to claim 1, wherein the active display area includes a polarizer, and the polarizer does not extend into the transparent area such that an area beneath the transparent area is visible when the electro-optic display device is activated and displays the information.

* * * * *